United States Patent
Yang (10) Patent No.: US 10,445,453 B2
(45) Date of Patent: Oct. 15, 2019

(54) CELL LAYOUT UTILIZING BOUNDARY CELL WITH MIXED POLY PITCH WITHIN INTEGRATED CIRCUIT

(71) Applicant: MEDIATEK INC., Hsin-Chu (TW)

(72) Inventor: Jen-Hang Yang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 487 days.

(21) Appl. No.: 15/081,936

(22) Filed: Mar. 27, 2016

(65) Prior Publication Data

US 2016/0300005 A1 Oct. 13, 2016

Related U.S. Application Data

(60) Provisional application No. 62/144,527, filed on Apr. 8, 2015.

(51) Int. Cl.
G06F 17/50 (2006.01)
H01L 27/02 (2006.01)
H01L 27/118 (2006.01)

(52) U.S. Cl.
CPC ...... *G06F 17/5072* (2013.01); *H01L 27/0207* (2013.01); *H01L 27/11807* (2013.01);
(Continued)

(58) Field of Classification Search
CPC ....... H01L 27/0207; H01L 2027/11859; H01L 2027/11862; G06F 17/5068
See application file for complete search history.

(56) References Cited

U.S. PATENT DOCUMENTS 6,381,166 B1 4/2002 Yoshida et al.
2008/0185688 A1* 8/2008 Kuesel ............... G06F 17/5072
257/618

(Continued)

FOREIGN PATENT DOCUMENTS

| CN | 1638096 A | 7/2005 |
| CN | 102467603 A | 5/2012 |
| CN | 103633063 B | 8/2017 |

OTHER PUBLICATIONS

Peter De Bisschop et al, Joint-Optimization of Layout and Litho for SRAM and Logic towards the 20nm node using 193i, Optical Microlithography XXIV, Mar. 17, 2011, pp. 1-18, Proc. of SPIE vol. 7973, XP060009195, DOI: 10.1117/12.881688, SPIE.

(Continued)

*Primary Examiner* — Vuthe Siek
*Assistant Examiner* — Aric Lin
(74) *Attorney, Agent, or Firm* — Han IP PLLC; Andy M. Han (57) ABSTRACT

A cell layout includes a first cell having a plurality of first poly lines extending along a first direction, a second cell having a plurality of second poly lines extending along the first direction, and a boundary cell contiguous with the first cell. The first poly lines have a first uniform poly pitch and the second poly lines have a second uniform poly pitch. The second uniform poly pitch is smaller than the first uniform poly pitch. The boundary cell includes n stripes of first dummy poly lines and m stripes of second dummy poly lines extending along the first direction. The first dummy poly lines have the first uniform poly pitch and the second dummy poly lines have the second uniform pitch.

10 Claims, 4 Drawing Sheets

(52) U.S. Cl.
CPC ............... *H01L 2027/11859* (2013.01); *H01L 2027/11862* (2013.01)

(56) References Cited

U.S. PATENT DOCUMENTS

| | | | |
|---|---|---|---|
| 2010/0164614 A1 | 7/2010 | Hou et al. | |
| 2011/0049575 A1* | 3/2011 | Tanaka | H01L 27/11807 257/206 |
| 2011/0207330 A1* | 8/2011 | Ohuchi | H01L 21/3086 438/703 |
| 2013/0148400 A1* | 6/2013 | Murooka | G11C 5/06 365/63 |
| 2013/0285190 A1* | 10/2013 | Peng | G06F 17/5072 257/499 |
| 2014/0115554 A1* | 4/2014 | Yeung | G06F 17/5068 716/122 |

OTHER PUBLICATIONS

State Intellectual Property Office, Office Action for China Patent Application No. 201610207915.9, dated Sep. 30, 2018.
China National Intellectual Property Administration, Office Action for China Patent Application No. 201610207915.9, dated Apr. 12, 2019.
European Patent Office, Official Communication regarding European Patent Application No. 16163109.8-1212, dated Apr. 17, 2019.

* cited by examiner

CELL LAYOUT UTILIZING BOUNDARY CELL WITH MIXED POLY PITCH WITHIN INTEGRATED CIRCUIT

CROSS REFERENCE TO RELATED APPLICATIONS

This application claims the benefit of U.S. provisional application No. 62/144,527 filed Apr. 8, 2015.

BACKGROUND

This invention relates in general to the field of circuit cells in an integrated circuit, and particularly to a cell layout utilizing boundary cells with mixed poly pitch within the integrated circuit.

As known in the art, when engineers design a complex integrated circuit, such as a microprocessor, a hierarchical approach is typically used. The design is broken down into high-level pieces that connect together to form the design. The high-level pieces are further broken down into yet smaller pieces that connect together to form the high-level pieces. This hierarchical breakdown may continue such that there are several levels in the hierarchy. The hierarchical approach has the advantage of making the complexity of the design manageable and achievable. The hierarchical approach also has the advantage of enabling different engineers to design different pieces of the design.

At the highest level, the design is made up of multiple pieces commonly referred to as "functional blocks" that are connected together to form the integrated circuit. For example, a microprocessor is made up of functional blocks such as arithmetic logic units, register files, cache memories, floating-point units, instruction translators, etc. The functional blocks have inputs and outputs that are coupled together to form the microprocessor design. Each of the functional blocks is made up of multiple smaller pieces commonly referred to as "cells." Examples of cells are logic gates, (e.g., AND, OR, NAND, NOR), flip-flops, multiplexers, registers, comparators, counters, etc. The cells have inputs and outputs that are coupled together to form a functional block. The cells may be standard cells chosen from a library of common cells. When engineers design a block, they typically focus first on which cells need to be included in the block and how the cells in the block will be connected logically, that is, which inputs will be connected to which outputs. Next, they focus on how the included cells will be physically placed within the block and how their inputs and outputs will be connected physically.

Typically, there are two methods of physically placing the cells within a functional block. One is for the designers themselves to physically place the cells within the functional block. This type of functional block is commonly referred to as a custom block. An example of a custom block is a high-density memory cell, such as a dynamic random access memory (DRAM) cell. The other method of physically placing the cells of a functional block is to employ computer-aided design software tools. These tools are commonly referred to as auto-place-route (APR) tools, and functional blocks whose placement is performed by APR tools are commonly referred to as APR blocks. APR tools take as input the list of cells that make up the block (including their physical area and input/output specifications), information that specifies how the cells are to be connected together, and a boundary of the block within which the tool is to place the cells.

With the increasing down-scaling of integrated circuits, the integrated circuits become more compact, and some restricted design rules have to be applied, which have become major limitations in the layout design. For standard cells that are frequently used in the integrated circuits, these restricted design rules cause the increase in the chip area usage, increased difficulty in the auto placement and route, and the violation in the design rule check.

SUMMARY

It is one object of the invention to provide an improved cell layout within the integrated circuits, which comprise at least two different poly pitches, which can be implemented in the IC design stage without the violation of design rule check.

According to one aspect of the invention, a cell layout within an integrated circuit is provided. The cell layout constitutes a portion of an application specific integrated circuit (ASIC) or a system on chip (SoC). The cell layout includes a first cell comprising a plurality of first poly lines extending along a first direction, wherein the plurality of first poly lines has a first uniform poly pitch and a first uniform poly line width; a second cell being spaced apart from the first cell, the second cell comprising a plurality of second poly lines extending along the first direction, wherein the plurality of second poly lines has a second uniform poly pitch and a second uniform poly line width, wherein the second uniform poly pitch is smaller than the first uniform poly pitch; and a boundary cell being contiguous with the first cell, the boundary cell comprising n stripes of first dummy poly lines and m stripes of second dummy poly lines extending along the first direction.

According to one embodiment, the n stripes of first dummy poly lines have the first uniform poly pitch and the m stripes of second dummy poly lines have the second uniform pitch, wherein n and m are both integers, and wherein n and m are both greater than or equal to 2. According to one embodiment, the first cell may be a standard cell chosen from a library of common cells.

According to another aspect of the invention, a cell layout within an integrated circuit includes an L-shaped cell comprising a plurality of poly lines extending along a first direction, wherein the plurality of poly lines has a first uniform poly pitch and a first uniform poly line width; and a boundary cell being contiguous with the L-shaped cell, the boundary cell having two common cell boundaries that are commonly shared with the L-shaped cell, the boundary cell comprising n stripes of first dummy poly lines and m stripes of second dummy poly lines extending along the first direction, wherein the n stripes of first dummy poly lines have the first uniform poly pitch and the m stripes of second dummy poly lines have the second uniform pitch, wherein n and m are both integers.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, and some details may be exaggerated relative to other elements for clarity. Like numbers refer to like elements throughout.

The description proposed herein is just a preferable example for the purpose of illustration only, not intended to limit the scope of the disclosure, so it would be understood that other equivalents and modifications could be made thereto without departing from the spirit and scope of the disclosure.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device or layout and are not intended to limit the scope of the invention.

Throughout the description, the terms "standard cell" and "macro" refer to the pre-designed cells that have been laid out. Also, the terms "standard cell" and "macro" are used interchangeably, while the term "standard cell" is generally used to refer to small cells, and the term "macro" is generally used to refer to large cells with more functions. The standard cells and macros are stored in circuit libraries, which may be in the form of a database.

In advanced semiconductor processing, the use of restricted design rules (RDRs) to improve the yield of the manufactured devices is known. One RDR used at the 32 nm node and beyond is that polysilicon pattern, the lowest conductor layer in the IC fabrication, is restricted to be placed in a unitary direction. That is, all of the polysilicon conductors are required to be parallel to one another and running in only the vertical, or only the horizontal, direction. Also, the polysilicon layer is further restricted to be of a uniform width and poly pitch. These restrictions insure more uniform results over process variations, that is, the devices manufactured with these restricted layout rules will have less process sensitivity. However, in some applications, it is desirable to design integrated circuits with mixed poly pitch without violation in the design rule check. The present invention addresses this issue.

Figure 1:
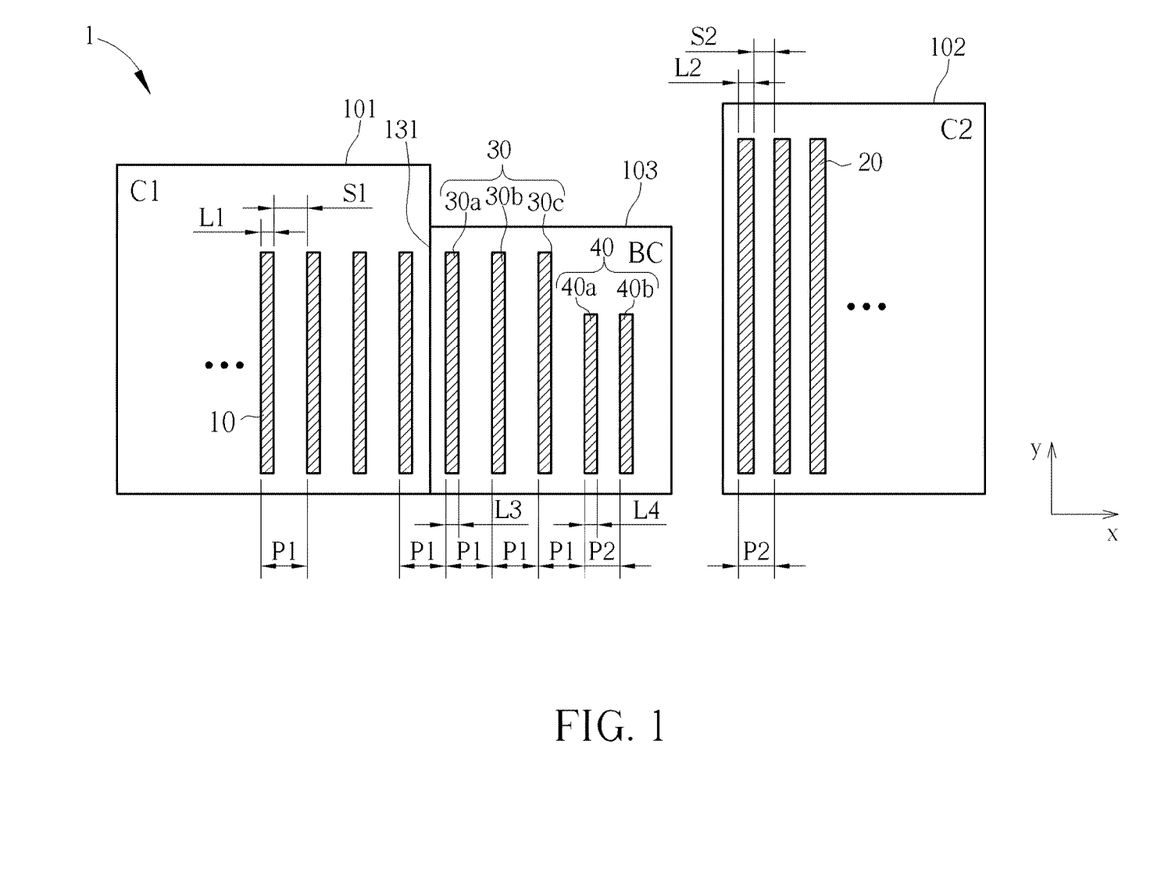
FIG. 1 illustrates an exemplary embodiment of the present invention, wherein a cell layout composed a layout of a cell C1, a layout of a cell C2, and a layout of a boundary cell BC are shown.

FIG. 1 illustrates an exemplary embodiment of the present invention, wherein a cell layout 1 composed a layout of a cell $C_1$, a layout of a cell $C_2$, and a layout of a boundary cell BC are shown. The cell layout 1 may be a portion of an application specific integrated circuit (ASIC) or a system on chip (SoC), but not limited thereto. It is understood that the figure illustrates in a very simplified plan view of three neighboring cells. For the sake of simplicity, only poly lines are shown in each cell. It is understood that other elements, such as ion wells, diffusion regions, power rails, or metal layers, may be arranged in each cell depending upon design requirements.

As shown in FIG. 1, the cell $C_1$, which may be a standard cell that maybe chosen from a library of common cells, has cell boundaries 101 that define the bounds and dimension of the cell $C_1$. For example, the cell C1 may be a logic cell including, but not limited to, a PMOS transistor and an NMOS transistor. According to the embodiment of the invention, a plurality of polysilicon lines (hereinafter "poly lines") 10 is disposed within the cell $C_1$. For the sake of simplicity, only four of the poly lines 10 are illustrated. According to the embodiment of the invention, the poly lines 10 are arranged in parallel with one another. According to the embodiment of the invention, the poly lines 10 are the lowest conductor layer in the IC fabrication, which is restricted to be all extended in a unitary direction at the 32 nm node and beyond. In FIG. 1, the poly lines 10 extend along a first direction such as a reference y-axis direction (uni-directional).

According to the embodiment of the invention, the poly lines 10 in the cell $C_1$ have a uniform poly pitch $P_1$ and uniform ploy line width $L_1$. The poly pitch $P_1$ is the combination of the poly line width $L_1$ and the spacing $S_1$ between two neighboring poly lines 10. According to the embodiment of the invention, the poly line width $L_1$ may be 20, 22, 24, or 28 nm, but not limited thereto. According to the embodiment of the invention, the poly pitch $P_1$ may be 100 nm, but not limited thereto.

According to the embodiment of the invention, the cell $C_2$, which is spaced apart from the cell $C_1$, has cell boundaries 102 that define the bounds and dimension of the cell $C_2$. For example, the cell $C_1$ may be a macro including, but not limited to, an analog macro or a memory macro such as Static Random Access Memory (SRAM) macro, a Dynamic Random Access Memory (DRAM) macro, or the like. The SRAM macro or the DRAM macro includes SRAM cells or DRAM cells forming an array, and may include supporting circuits for supporting the operation of the memory array. The supporting circuits may include row decoders, sense amplifier, power gating circuitry, and level shifter circuitry, for example.

According to the embodiment of the invention, a plurality of poly lines 20 is disposed within the cell $C_2$. For the sake of simplicity, only three of the poly lines 20 are illustrated. According to the embodiment of the invention, the poly lines 20 are arranged in parallel with one another. According to the embodiment of the invention, the poly lines 20 are the lowest conductor layer in the IC fabrication, which is restricted to be all extended in a unitary direction at the 32 nm node and beyond. In FIG. 1, the poly lines 20 extend along the reference y-axis direction (uni-directional).

According to the embodiment of the invention, the poly lines 20 in the cell $C_2$ have a uniform poly pitch $P_2$ and uniform ploy line width $L_2$. The poly pitch $P_2$ is the combination of the poly line width $L_2$ and the spacing $S_2$ between two neighboring poly lines 20. According to the embodiment of the invention, the poly line width $L_2$ may be 20, 22, 24, or 28 nm, but not limited thereto. According to the embodiment of the invention, the poly pitch $P_2$ may be 90 nm, but not limited thereto. According to the embodiment of the invention, the poly pitch $P_2$ is smaller than the poly pitch $P_1$.

The use of the uniform pitch and width of the polysilicon portions, and restricting the layout to a uni-direction in the polysilicon layer, has benefits in increasing the tolerance of the finished devices to process variations and critical dimension (CD) tolerance.

According to the embodiment of the invention, the boundary cell BC is contiguous with the cell $C_1$. The boundary cell BC has cell boundaries 103 that define the bounds and dimension of the boundary cell BC and has a common cell boundary 131 that is commonly shared with the cell $C_1$. According to the embodiment of the invention, the boundary cell BC comprises n stripes of first dummy poly lines 30 and m stripes of second dummy poly lines 40, wherein n and m are both integers. According to the embodiment of the invention, preferably, n and m are both integers greater than or equal to 2. In the illustrated embodiment, as shown in FIG. 1, three first dummy poly lines 30a, 30b, 30c and two second dummy poly lines 40a and 40b are demonstrated. However, it is understood that other numbers of the first dummy poly lines 30 and second dummy poly lines 40 may be employed, depending upon the design requirements.

According to the embodiment of the invention, the first dummy poly lines 30 and second dummy poly lines 40 extend along the first direction (i.e. reference y-axis direction). According to the embodiment of the invention, the first dummy poly lines 30 may have fixed or flexible poly line width $L_3$. For example, the poly line width $L_3$ may be 20, 22, 24, or 28 nm, but not limited thereto. According to the embodiment of the invention, the second dummy poly lines 40 may have fixed poly line width $L_4$, for example, $L_4$=20 nm.

According to the embodiment of the invention, the parallel first dummy poly lines 30 and the second dummy poly lines 40 are arranged successively along a second direction (i.e. the reference x-axis direction) that is perpendicular to the first direction. According to the embodiment of the invention, the first dummy poly lines 30 may have the poly pitch $P_1$ and the second dummy poly lines may have the poly pitch $P_2$. In FIG. 1, the left-most first dummy poly line 30a is disposed in close proximity to the right-most poly line 10 in the cell $C_1$ with the poly pitch $P_1$. The common cell boundary 131 is disposed between the left-most first dummy poly line 30a and the right-most poly line 10. Therefore, the poly lines 10 in the cell $C_1$ and the first dummy poly lines 30 in the boundary cell BC have the same poly pitch $P_1$.

According to the embodiment of the invention, the left-most second dummy poly line 40a is disposed in close proximity to the right-most first dummy poly line 30c in the boundary cell BC with the poly pitch $P_1$. The other second dummy poly line 40b is disposed in close proximity to the second dummy poly line 40a in the boundary cell BC with the poly pitch $P_2$. According to the embodiment of the invention, the second dummy poly lines 40 may have a shorter length than the first dummy poly lines 30. For example, the second dummy poly lines 40 may have a length along the first direction or the reference y-axis direction that is about 60%~70% of the length of the first dummy poly lines 30.

It is advantageous to use the present invention because by introducing the boundary cells, the cell layouts within the integrated circuits, which comprise at least two different poly pitches, can be implemented in the IC design stage without the violation of design rule check.

Figure 2:
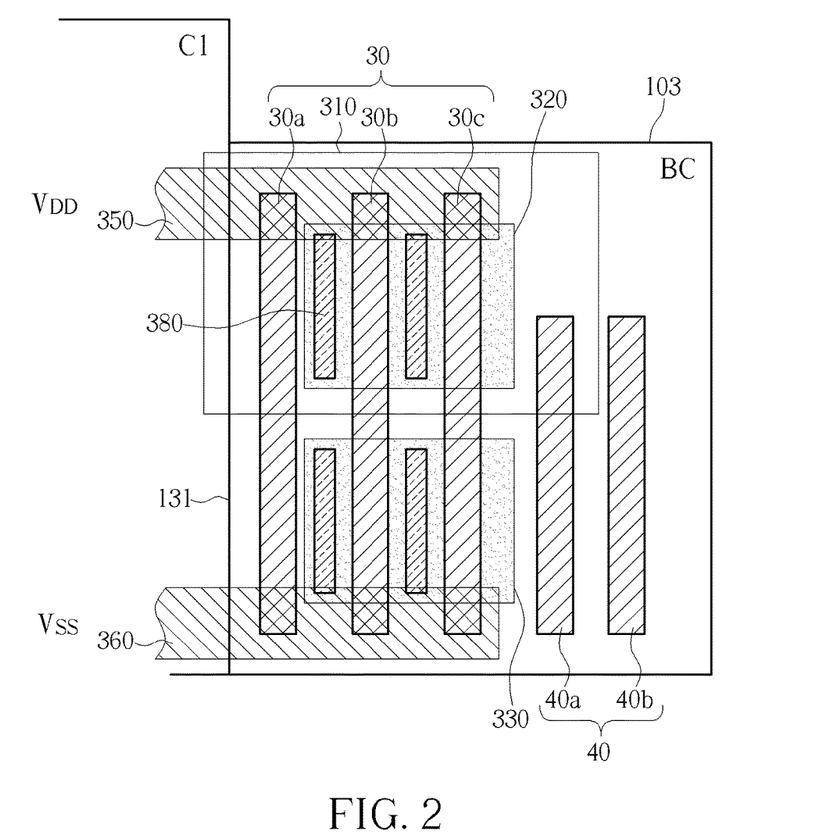
FIG. 2 is an enlarged plan view of an exemplary boundary cell according to one embodiment of the invention.

FIG. 2 is an enlarged plan view of an exemplary boundary cell BC according to one embodiment of the invention, wherein additional components such as power rails, ion well, and diffusion regions are illustrated in addition to the dummy poly lines, wherein like numeral numbers designate like elements, regions, or layers. The regions or boundaries illustrated in the FIG. 2 are schematic in nature and their shapes are not intended to illustrate the actual shape of a region of a device or layout and are not intended to limit the scope of the invention.

As shown in FIG. 2, the exemplary boundary cell BC may further comprise an N well 310 on a P type semiconductor substrate (not explicitly shown). The exemplary boundary cell BC may further comprise diffusion regions 320 and 330. For example, the diffusion regions 320 may be $P^+$ regions and the diffusion regions 330 may be $N^+$ region, but not limited thereto. The exemplary boundary cell BC may further comprise middle end metal patterns 380 between the first dummy poly lines 30a, 30b, and 30c. The exemplary boundary cell BC may further comprise power rails 350 and 360. For example, the power rail 350 may be $V_{DD}$ power rail and the power rail 360 may be $V_{SS}$ power rail, but not limited thereto. The power rails 350 and 360 may extend laterally into the neighboring cell $C_1$.

Figure 3:
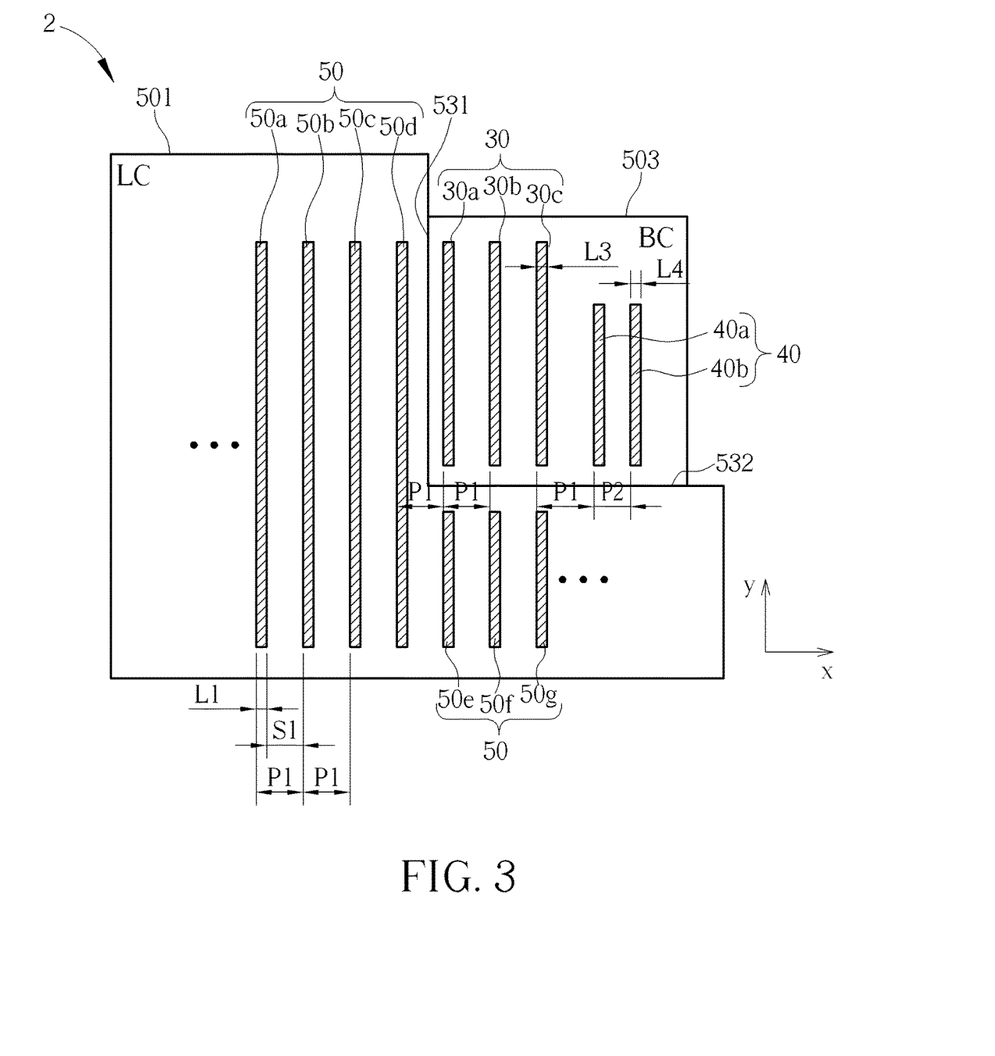
FIG. 3 illustrates another embodiment of the present invention, wherein a cell layout composed an L-shaped cell C and a layout of a boundary cell BC are shown.

FIG. 3 illustrates another embodiment of the present invention, wherein a cell layout 2 composed an L-shaped cell LC and a layout of a boundary cell BC are shown. The cell layout 2 may be a portion of an application specific integrated circuit (ASIC) or a system on chip (SoC), but not limited thereto. It is understood that the figure illustrates in a very simplified plan view of two neighboring cells. For the sake of simplicity, only poly lines are shown in each cell.

As shown in FIG. 3, the L-shaped cell LC has cell boundaries 501 that define the bounds and dimension of the L-shaped cell LC. The L-shaped cell LC may be a standard cell that may be chosen from a library of common cells. For example, the L-shaped cell LC may be a logic cell including, but not limited to, a PMOS transistor and an NMOS transistor. According to the embodiment of the invention, a plurality of poly lines 50 is disposed within the L-shaped cell LC. For the sake of simplicity, only poly lines 50a~50g are illustrated. According to the embodiment of the invention, the poly lines 50a~50g are arranged in parallel with one another. According to the embodiment of the invention, the poly lines 50a~50g are the lowest conductor layer in the IC fabrication, which is restricted to be all extended in a unitary direction at the 32 nm node and beyond. In FIG. 3, likewise, the poly lines 50a~50g extend along the first direction (reference y-axis direction). According to the embodiment of the invention, the poly lines 50e~50g are arranged in a lower area of the L-shaped cell LC and have a shorter ploy length than the poly lines 50a~50d.

According to the embodiment of the invention, the poly lines 50a~50g in the L-shaped cell LC have a uniform poly pitch $P_1$ and uniform ploy line width $L_1$. The poly pitch $P_1$ is the combination of the poly line width $L_1$ and the spacing $S_1$ between two neighboring poly lines 50a~50g. According to the embodiment of the invention, the poly line width $L_1$ may be 20, 22, 24, or 28 nm, but not limited thereto. According to the embodiment of the invention, the poly pitch $P_1$ may be 100 nm, but not limited thereto. The use of the uniform pitch and width of the polysilicon portions, and restricting the layout to a uni-direction in the polysilicon layer, has benefits in increasing the tolerance of the finished devices to process variations and critical dimension (CD) tolerance.

According to the embodiment of the invention, the boundary cell BC is contiguous with the L-shaped cell LC. The boundary cell BC has cell boundaries 503 that define the bounds and dimension of the boundary cell BC and may have two common cell boundaries 531 and 532 that are commonly shared with the L-shaped cell LC. Likewise, the boundary cell BC comprises n stripes of first dummy poly lines 30 and m stripes of second dummy poly lines 40, wherein n and m are both integers. According to the embodiment of the invention, preferably, n and m are both integers greater than or equal to 2. In the illustrated embodiment, as shown in FIG. 3, three first dummy poly lines 30a, 30b, 30c and two second dummy poly lines 40a and 40b are demonstrated. However, it is understood that other numbers of the first dummy poly lines 30 and second dummy poly lines 40 may be employed, depending upon the design requirements.

According to the embodiment of the invention, the first dummy poly lines 30 and second dummy poly lines 40 extend along the first direction (i.e. reference y-axis direction). According to the embodiment of the invention, the first dummy poly lines 30 may have fixed or flexible poly line width $L_3$. For example, the poly line width $L_3$ may be 20, 22, 24, or 28 nm, but not limited thereto. According to the embodiment of the invention, the second dummy poly lines 40 may have fixed poly line width $L_4$, for example, $L_4$=20 nm. According to the embodiment of the invention, the poly lines 50e~50g may be aligned with the first dummy poly lines 30a~30c, respectively. A distance t between one distal end of the first dummy poly lines 30 and one distal end of the poly lines 50e~50g may range between 206 nm and 1256 nm, but not limited thereto.

According to the embodiment of the invention, the parallel first dummy poly lines 30 and the second dummy poly lines 40 are arranged successively along a second direction (i.e. the reference x-axis direction) that is perpendicular to the first direction. According to the embodiment of the invention, the first dummy poly lines 30 may have the poly pitch $P_1$ and the second dummy poly lines may have the poly pitch $P_2$ ($P_2<P_1$). In FIG. 3, the left-most first dummy poly line 30a is disposed in close proximity to the poly line 50d in the L-shaped cell LC with the poly pitch $P_1$. The common cell boundary 531 is disposed between the left-most first dummy poly line 30a and the poly line 50d. Therefore, the poly lines 50a~50g in the L-shaped cell LC and the first dummy poly lines 30 in the boundary cell BC have the same poly pitch $P_1$.

Figure 4:
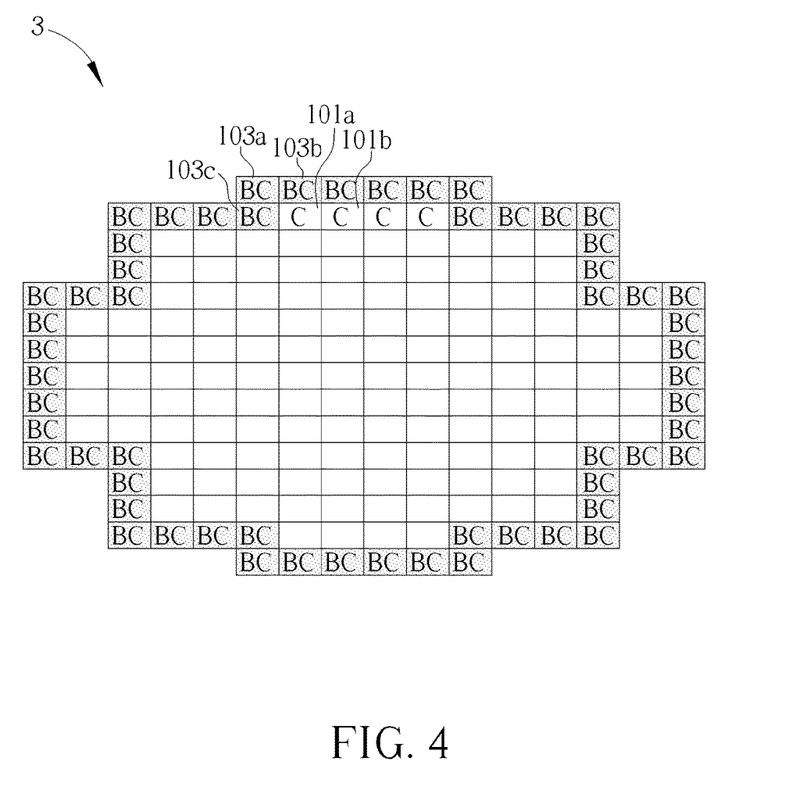
FIG. 4 is a schematic layout diagram showing an exemplary boundary cell placement according to another embodiment of the invention.

FIG. 4 is a schematic cell layout 3 showing an exemplary boundary cell placement according to another embodiment of the invention. As shown in FIG. 4, the cell layout 3 comprises an array of standard cells C arranged in a central region. The array of standard cells C may be surrounded by a plurality of boundary cells BC. Some of the boundary cells BC, for example, the boundary cell 103a is disposed at a corner of a specific standard cell, for example, standard cell 101a and the boundary cell 103b is disposed at a corner of a specific standard cell, for example, standard cell 101b. A boundary cell 103c is disposed next to the standard cell 101a along the left side of the standard cell 101a. It is understood that the boundary cells BC may be placed along perimeters or sides of the standard cells in the array or may be disposed at the corners of some of the standard cells in the array.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device, comprising:
    an integrated circuit comprising:
        a first cell comprising a plurality of first poly lines extending along a first direction, wherein said plurality of first poly lines has a first uniform poly pitch and a first uniform poly line width;
        a second cell being spaced apart from said first cell, said second cell comprising a plurality of second poly lines extending along said first direction, wherein said plurality of second poly lines has a second uniform poly pitch and a second uniform poly line width, wherein said second uniform poly pitch is smaller than said first uniform poly pitch; and
        a boundary cell being contiguous with said first cell, said boundary cell comprising n stripes of first dummy poly lines and m stripes of second dummy poly lines extending along said first direction, wherein said n stripes of first dummy poly lines have said first uniform poly pitch and said m stripes of second dummy poly lines have said second uniform poly pitch, wherein n and m are both integers, and wherein n and m are both greater than or equal to 2.

2. The device according to claim 1, wherein said first dummy poly lines and said second dummy poly lines are arranged successively along a second direction that is perpendicular to said first direction.

3. The device according to claim 1, wherein said first cell is a standard cell chosen from a library of common cells.

4. The device according to claim 1, wherein said first cell comprises a logic cell.

5. The device according to claim 1, wherein said second cell is a macro.

6. The device according to claim 1, wherein said macro comprises an analog macro or a memory macro.

7. The device according to claim 1, wherein said boundary cell has cell boundaries including a common cell boundary commonly shared with said first cell.

8. The device according to claim 1, wherein said integrated circuit comprises a portion of an application specific integrated circuit (ASIC) or a system on chip (SoC).

9. The device according to claim 1, wherein said first uniform poly pitch is 100 nm and said second uniform poly pitch is 90 nm.

10. The device according to claim 1, wherein said first uniform poly line width is selected from a group consisting of 20, 22, 24, or 28 nm, and said second uniform poly line width is 24 nm.

* * * * *